US007592613B2

(12) United States Patent
Kristiansson et al.

(10) Patent No.: US 7,592,613 B2
(45) Date of Patent: Sep. 22, 2009

(54) SENSOR AND SYSTEM FOR SENSING AN ELECTRON BEAM

(75) Inventors: Anders Kristiansson, Lund (SE); Lars Åke Näslund, Furulund (SE); Hans Hallstadius, Lund (SE); Werner Haag, Lugnorre (CH); Kurt Holm, Baden (CH); Benno Zigerlig, Untersiggenthal/AG (CH)

(73) Assignee: Tetra Laval Holdings & Finance S.A., Pully (CH)

( * ) Notice: Subject to any disclaimer, the term of this patent is extended or adjusted under 35 U.S.C. 154(b) by 277 days.

(21) Appl. No.: 11/812,050

(22) Filed: Jun. 14, 2007

(65) Prior Publication Data

US 2007/0290148 A1 Dec. 20, 2007

Related U.S. Application Data

(60) Provisional application No. 60/814,532, filed on Jun. 19, 2006.

(30) Foreign Application Priority Data

Jun. 14, 2006 (SE) .................................... 0601304

(51) Int. Cl.
*G01T 1/29* (2006.01)
*G01T 1/16* (2006.01)
*B65B 55/08* (2006.01)
*G01R 19/00* (2006.01)

(52) U.S. Cl. .................................... 250/492.3; 250/397

(58) Field of Classification Search .............. 250/492.3, 250/397

See application file for complete search history.

(56) References Cited

U.S. PATENT DOCUMENTS

| | | | | |
|---|---|---|---|---|
| 6,657,212 | B2 | 12/2003 | Komori et al. | |
| 7,368,739 | B2 * | 5/2008 | Kristiansson et al. | 250/492.3 |
| 7,375,345 | B2 * | 5/2008 | Kristiansson et al. | 250/397 |
| 2004/0119024 | A1 | 6/2004 | Avnery | |
| 2004/0251431 | A1 | 12/2004 | Yamaguchi et al. | |
| 2007/0090303 | A1 | 4/2007 | Kristiansson et al. | |
| 2007/0114432 | A1 | 5/2007 | Kristiansson et al. | |
| 2007/0114433 | A1 | 5/2007 | Kristiansson et al. | |

FOREIGN PATENT DOCUMENTS

| | | | |
|---|---|---|---|
| JP | 11-248893 | A | 9/1999 |
| WO | 2004/061890 | A2 | 7/2004 |
| WO | 2004/110868 | A1 | 12/2004 |
| WO | 2004/110869 | A1 | 12/2004 |
| WO | 2005/002973 | A1 | 1/2005 |

OTHER PUBLICATIONS

International Search Report dated Dec. 20, 2006.

* cited by examiner

*Primary Examiner*—Jack I Berman
(74) *Attorney, Agent, or Firm*—Buchanan Ingersoll & Rooney PC

(57) ABSTRACT

A sensor is adapted to sense the intensity of an electron beam generated by an electron beam generator and exited from the generator through an exit window along a path towards a target within a target area. The sensor comprises at least one area of at least one conductive layer located within the path and connected to a current detector. The area, or areas, of the at least one conductive layer are shielded from the surrounding environment and from the exit window (and from one another when there are more than one area) by a shield. The shield is formed on the exit window. The sensor forms a part of a sensing system.

20 Claims, 4 Drawing Sheets

SENSOR AND SYSTEM FOR SENSING AN ELECTRON BEAM

This application is based on and claims priority under 35 U.S.C. § 119(e) with respect to U.S. provisional application No. 60/814,532 filed on Jun. 19, 2006, the entire content of which is incorporated herein by reference.

TECHNICAL FIELD

The disclosure generally pertains to electron beam sensing. More specifically, the disclosure relates to a sensor for sensing an electron beam and a system for sensing an electron beam.

BACKGROUND DISCUSSION

Within the food packaging industry, packages have been used for a long time which are formed from a web or a blank of packaging material comprising different layers of paper or board, liquid barriers of for example polymers and gas barriers of for example thin films of aluminium. To extend the shelf-life of the products being packed, it has been known to sterilize the web before the forming and filling operations, and to sterilize the partly formed packages (ready-to-fill packages, RTF packages) before the filling operation. Depending on the length of shelf-life desired and whether the distribution and storage is made in at a chilled or ambient temperature, different levels of sterilization can be chosen. One way of sterilizing a web involves chemical sterilization using, for example, a bath of hydrogen peroxide. Similarly, a ready-to-fill package can be sterilized by hydrogen peroxide, preferably in a gas phase.

Another way to sterilize packaging material is to irradiate it by electrons emitted from an electron beam emitting device such as, for example, an electron beam generator. Such sterilization of a web of packaging material is disclosed in International Application Publication Nos. WO 2004/110868 and WO 2004/110869. Similar irradiation of ready-to-fill packages is disclosed in International Application Publication No. WO 2005/002973. The disclosure in each of the three international application publications mentioned above is hereby incorporated by reference.

To provide on-line control of the intensity of the electron beam, and to monitor uniformity variations, electron sensors are used for dose irradiation measurement. A signal from the sensor is analyzed and fed back into an electron beam control system as a feedback control signal. In the sterilization of packaging material, such sensor feedback can be used to assure a sufficient level of sterilization.

One kind of existing sensor for measuring electron beam intensity, based on direct measuring methods, uses a conductor placed within a vacuum chamber. The vacuum chamber is used to provide isolation from the surrounding environment. Because vacuum-based sensors can be relatively large, they are located at positions outside the direct electron beam path to avoid shadowing of target objects. Shadowing can, for example, preclude proper irradiation (and thus, proper sterilization) of packaging material. Therefore, these sensors rely on secondary information from a periphery of the beam, or information from secondary irradiation, to provide a measurement.

In operation, electrons from the electron beam which have sufficient energy will penetrate a window, such as a titanium (Ti) window of the vacuum chamber and be absorbed by the conductor. The absorbed electrons establish a current in the conductor. The magnitude of this current is a measure of the number of electrons penetrating the window of the vacuum chamber. This current provides a measure of the intensity of the electron beam at the sensor position.

A known electron beam sensor that has a vacuum chamber with a protective coating, and an electrode representing a signal wire inside the chamber, is described in U.S. Application Publication No. 2004/0119024. The chamber walls are used to maintain a vacuum volume around the electrode. The vacuum chamber has a window accurately aligned with the electrode to sense the electron beam density. The sensor is configured for placement at a location, relative to a moving article being irradiated, opposite the electron beam generator for sensing secondary irradiation.

A similar electron beam sensor is described in International Application Publication No. WO 2004/061890. In one embodiment of this sensor, the vacuum chamber is removed and the electrode is provided with an insulating layer or film. The insulating layer is provided to avoid influence from electrostatic fields and plasma electrons created by the electron beam from substantially influencing the electrode output.

U.S. Pat. No. 6,657,212 describes an electron beam irradiation processing device wherein an insulating film is provided on a conductor, such as a stainless steel conductor, of a current detection unit placed outside a window of an electron beam tube. A current measuring unit includes a current meter that measures the current detected. This patent describes advantages of a ceramic coated detector.

Another type of sensor is described in U.S. Application Publication No. 2007/0114432 filed by the assignee. The disclosed sensor comprises a conducting wire and an isolating shield shielding off at least a portion of the conducting wire from plasma exposure. The plasma shield also comprises an outer conductive layer connected to ground potential for absorbing the plasma. The detector is small and may be placed outside the electron exit window in front of the electron beam. By adding several detectors and distributing them across the electron exit window, multiple measuring points are achieved resulting in a dose mapping of the electron beam.

U.S. Application Publication No. 2007/0090303, also filed by the assignee, describes a multilayer detector which can be used for sensing an electron beam. The detector comprises a conductive wire which is isolated from the surroundings by a thin insulating material. On top of the insulating material a layer of conducting material is deposited, which is connected to a ground potential. Only electrons from the electron beam are capable of penetrating the outer layers to be absorbed by the conducting wire. The outer conducting layer absorbs plasma. The detector is small and may be placed outside the electron exit window in front of the electron beam. By adding several detectors and distribute them across the electron exit window, multiple measuring points are achieved resulting in a dose mapping of the electron beam.

In Swedish Patent Application No. 0502384-1, filed by the assignee, a further sensor is described. The sensor comprises a conductor and an insulating housing. The housing is attached to the electron exit window of the electron beam generator and forms a closed chamber together with said window. The conductor is located in the chamber and is thereby shielded from plasma.

SUMMARY

A sensor is adapted to sense an intensity of an electron beam generated by an electron beam generator along a path towards a target within a target region, with the electron beam exiting from the generator through an exit window. The sensor comprises at least one area of at least one conductive layer located within the path and connected to a current detector, and a shield shielding off the at least one area of the at least one conductive layer from surrounding environment and from the exit window. A portion of the shield is in contact with the at least one area of the at least one conductive layer, and the shield is formed on the exit window and at least the portion of the shield in contact with the at least one area being made of insulating material.

The sensor is an integrated portion of the exit window and requires a negligible amount of extra space. The electrons can penetrate the thin sensor structure and a fraction, in the range of approximately a few percentage, of the energy of the electrons will be absorbed by the conducting material of the sensor. The absorbed energy give rise to currents which provide a measure of the intensity of the electron beam over the sensor.

According to another aspect, a system for sensing an electron beam comprises an electron beam generator adapted to generate an electron beam exiting from the generator through an exit window and along a path towards a target in a target region, a support for supporting the target within the target region, and a sensor adapted to detect and measure intensity of the electron beam generated by the electron beam generator. The sensor comprises at least one area of at least one conductive layer located within the path, a current detector connected to the at least one conductive layer, and a shield shielding off the at least one area of the at least one conductive layer from surrounding environment and from the exit window. A portion of the shield is in contact with the at least one area of the at least one conductive layer, and the shield is formed on the exit window and at least the portion of the shield in contact with the at least one area being made of insulating material.

BRIEF DESCRIPTION OF THE DRAWINGS

The foregoing and additional features and characteristics of the disclosed sensor and system for sensing an electron beam will be described in greater detail below with reference to the accompanying drawing figures, wherein like reference numerals are used to designate like elements.

It should be noted that the thicknesses of the layers shown in the figures have been exaggerated, and that the figures are not drawn according to scale.

DETAILED DESCRIPTION

Figure 1:
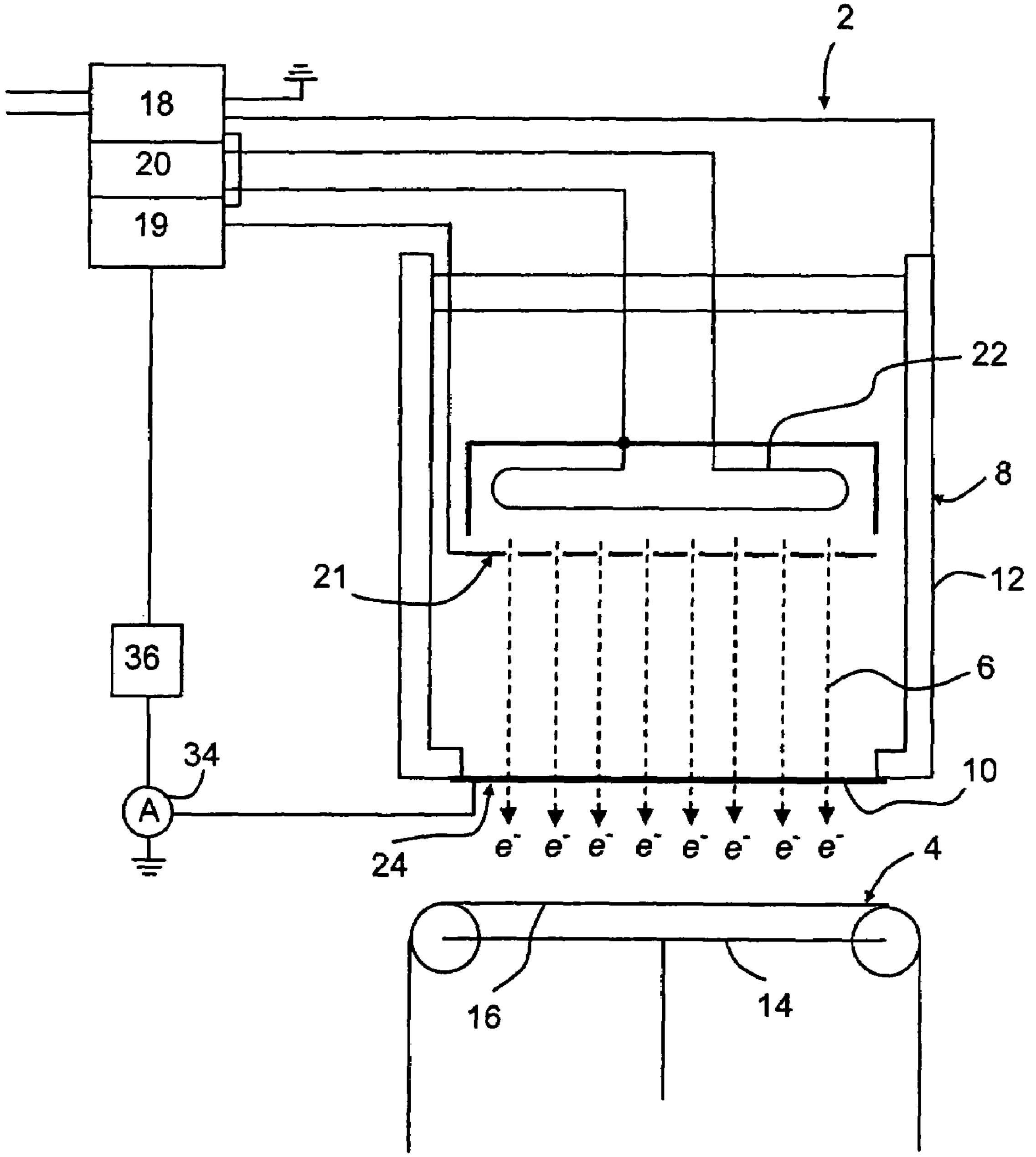
FIG. 1 schematically shows an example of a system for irradiating a target in the form of a web with an electron beam.

FIG. 1 illustrates an example of a system 2 for irradiating a target area or region 4 within an electron beam 6 emitted along a path. The system 2 includes means for emitting an electron beam 6 along a path. In the illustrated embodiment, the emitting means comprises an electron beam generator 8. The system 2 also includes means for detecting electron beams 6. In the illustrated embodiment, the detecting means is a sensor 10. Thus, the system 2 includes both an electron beam generator 8 and a sensor 10.

The sensor 10 senses the intensity of the electron beam 6 generated by the electron beam generator 8 along a path which irradiates the target area 4. The electron beam generator 8 includes a vacuum chamber 12. The electron beam sensor 10 is formed and located in a way to be able to detect and measure the intensity of the electron beam 6 exiting the vacuum chamber 12.

A support 14 is provided for supporting a target 16 within the target area 4. In the embodiment shown in FIG. 1, the target is a web of packaging material 16 and the support 14 for the target can, for example, be a web material transport roller or any other suitable device of a packaging machine. Further, the support 14 can be used to hold the target 16 in the target area 4 at a desired measuring position relative to the sensor 10 and the generator 8.

The electron beam generator 8, as shown in FIG. 1, includes a high voltage power supply 18, suitable for providing sufficient voltage to drive the electrical beam generator 8 for the desired application. The electron beam generator 8 also includes a filament power supply 20 which transforms power from the high voltage power supply 18 to a suitable input voltage for a filament 22 of the generator 8. In addition, the high voltage power supply 18 includes a grid control 19 for controlling a grid 21 used for diffusing the electron beam 6 into a more uniform beam and for focusing the electron beam towards the target area 4.

The filament 22 can be housed in the vacuum chamber 12. In one disclosed embodiment, the vacuum chamber 12 can be hermetically sealed. In operation, electrons $e^-$ from the filament 22 are emitted along an electron beam path 6 in a direction towards the target area 4.

Further, the electron beam generator 8 is provided with an electron exit window 24 through which the electrons exit the vacuum chamber. The window 24 can be made of a metallic foil 25, shown in FIG. 2, such as for example titanium, and can have a thickness in the order of 4-12 μm. A supporting net 27 formed of aluminium or copper supports the foil 25 from inside of the electron beam generator 8.

The sensor 10 is formed on the exit window 24 and is thereby an integrated portion of the window. It comprises at least one area 26 of at least one conductive layer 28 located within the electron beam path 6. In a first presently preferred embodiment, the sensor 10 comprises a single conductive layer 28.

Figure 3:
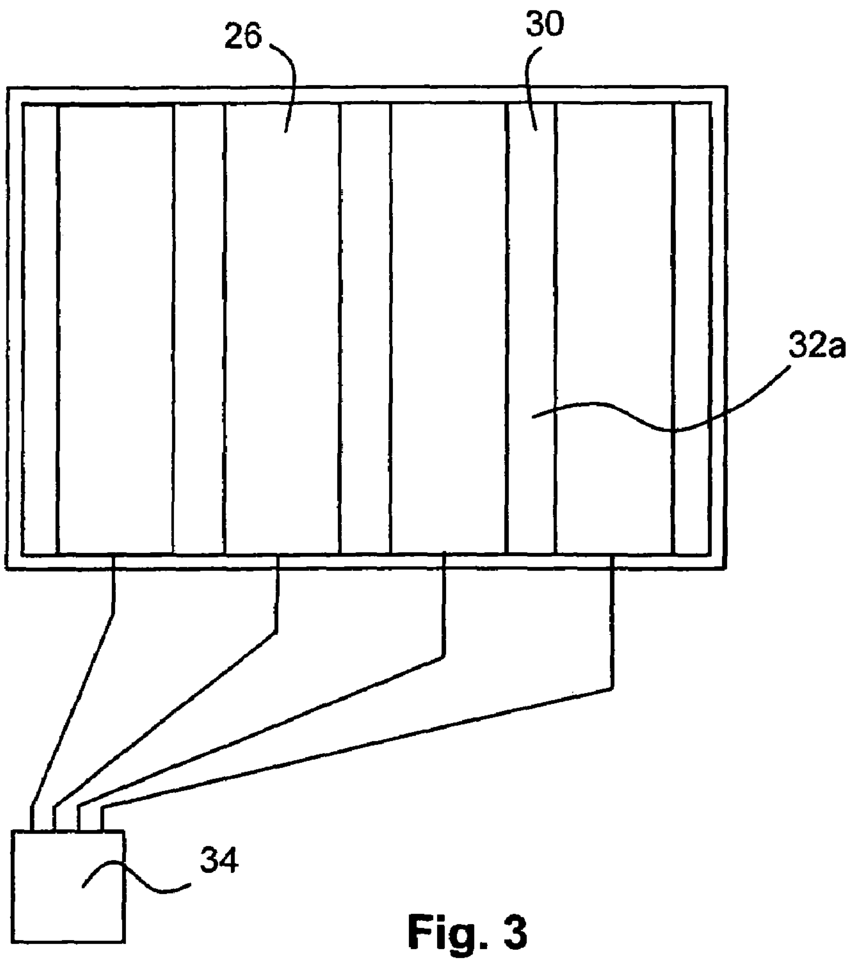
FIG. 3 schematically shows a planar top view of the sensor in FIG. 2, where the bands of the conductive layer are deposited, but not the outer insulating layer.

The conductive layer 28 is made up of several areas 26 of conductive material. Each area 26 is formed as a band placed across the exit window 24 as shown in FIG. 3. To isolate the bands 26 from each other, a gap 30 exists between the bands. In this example, the width of the bands 26 is in the range of 10-30 mm and the bands are positioned approximately 1 mm apart from each other. Further, each band 26 has substantially the same area.

A shield 32 of insulating material shields off the bands 26 in the conductive layer 28 from each other, from the surrounding environment and from the foil of the electron exiting the window 24. The function of the shield 32 is to protect the bands 26 from plasma contained in the surrounding environment around the exit window 24, and to help make sure that the bands 26 are not in direct contact with any other conducting material, for example the titanium foil of the exit window 24 and the other bands 26.

The shield 32 according to this first embodiment comprises at least a first and a second insulating layer 32*a*, 32*b*. The first insulating layer 32*a* covers substantially the entire foil of the exit window 24. On top of the insulating layer 32*a*, the bands 26 of the conductive layer 28 are formed. Over the bands 26 and over the still partly exposed first insulating layer 32*a*, the second insulating layer 32*b* is formed. Thereby, the bands 26 of the conductive layer 28 are encapsulated by insulating material.

The sensor 10 is formed on the foil 25 of the exit window 24. This means that the sensor 10 is located outside the vacuum chamber 12 and is facing the environment surrounding the electron beam generator 8.

The layers, both the insulating layers 32*a*, 32*b* and the conductive layer 28, are very thin and can be formed using deposition technology. For example plasma vapour deposition technique or chemical vapour deposition technique can be used. Other techniques for forming thin layers of material are of course also possible.

Preferably, the same technique is used for all the layers in the sensor 10. The areas, i.e., the bands 26, of the conductive layer 28 can be deposited by providing a mask to the first insulating layer 32*a* to cover the portions where any conductive area 26 is not desired.

The thickness selected for the layers can be of any suitable dimension. For example, thin layers can be used. In one example, the layers can be in the range of approximately 0.1-1 micrometers (μm), or lesser or greater as desired. Preferably, the thickness is the same or substantially the same for all layers within the sensor 10.

The insulating layers 32*a*, 32*b* can be made of any insulating material that can withstand temperatures in the order of a few hundred degrees Celsius (up to about 400 degrees Celsius). Preferably, the insulating material is an oxide. One oxide that may be used is aluminium oxide ($Al_2O_3$). Other insulating materials can of course also be used, for example different types of ceramic material. The term "insulating" refers to the material in the insulating layers being electrically insulating, i.e., non-conductive.

Preferably, the conductive layer 28 is made of metal. One metal that may be used is aluminium. Other conductive materials can of course also be used, for example diamond, diamond like carbon (DLC) and doped materials.

To be able to measure the electron beam intensity each band 26 is connected to a current detector 34. Connectors between the bands 26 and the current detector 34 are preferably located at the outer frame of the window 24.

Electrons from the electron beam 6 will penetrate the exit window 24 and, unlike the prior art sensors mentioned in the introductory portion, also penetrate the thin sensor structure. Hence, the electrons will not be totally absorbed by the conductive material, but only a fraction, in the range of approximately a few percentage, of the energy of the electrons will be absorbed by the conducting material of the sensor. The absorbed energy gives rise to a current in the band 26 and the signal from each conductive band 26 is separately detected and handled by a current detector 34 and provides a measure of the intensity of the electron beam over the band. The current detector 34 can comprise an amplifier and a voltmeter in combination with a resistor, or an ampere meter, or any other suitable device.

In this respect it should be noted that, compared to the prior art sensors discussed above, a larger portion of the exit window 24 can be covered by the sensor 10, but that the signal detected will be much smaller per area unit.

An output from the current detector 34 can be compared with a preset value or be supplied to a controller 36, which in turn can serve as a means for adjusting the intensity of the electron beam in response to an output of the sensor 10. By way of example, the electron beam can be emitted with an energy of, for example, less than 100 keV, e.g. 60 to 80 keV.

Figure 4:
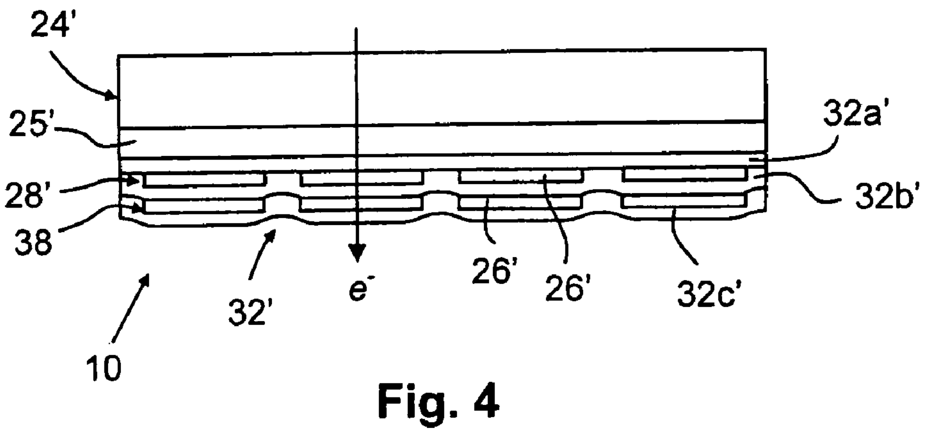
FIG. 4 schematically shows, in cross-section, a second embodiment of the sensor as disclosed herein.

FIG. 4 shows a sensor 10' according to a second embodiment.

Here, the sensor 10' is of a sandwich structure type and comprises a first and a second conductive layer 28', 38, each comprising at least one area 26' for sensing electron beam intensity. In this case, the first and second layers 28', 38 each comprise several areas 26' in the form of bands, similar to the bands 26 in the previously described first embodiment. The first and the second layers 28', 38 are placed on top of each other, but it is of course needed to have insulation to shield them from each other, from the exit window foil 25' and from the surrounding environment. To encapsulate the conductive layers 28', 38 the shield 32' comprises first, second and third insulating layers 32*a*', 32*b*', 32*c*. The first layer 32*a*' covers, in this case, substantially the entire foil 25' of the exit window 24' and carries the first conductive layer 28', i.e., the bands 26' of the first conductive layer 28' are deposited on the first insulating layer 32*a*'. The second insulating layer 32*b*' is deposited on top of the still partly exposed first insulating layer 32*a*' and on top of the bands 26' of the first conductive layer 28'. Thereby, the bands 26' of the first conductive layer 28' are encapsulated by insulating material. The second insulating layer 32*b*' carries the second conductive layer 38, i.e., the areas, in this case bands 26', of conductive material deposited on the second insulating layer 32*b*'. The third insulating layer 32*c* is deposited on top of the still partly exposed second insulating layer 32*b*' and the bands 26' of the second conductive layer 38. Thereby, the bands 26' of the second conductive layer 38 are encapsulated by insulating material.

A further embodiment of the sensor 10 may comprise any number of additional layers of conductive material. In such alternatives, the conductive layers are sandwiched one by one between insulating layers. Similar to the first and second embodiment this sandwich structure begins with a first insulating layer formed on the exit window and a last insulating layer covering at least the last conductive layer to protect it from the surrounding environment.

A sensor with several layers of conductive material in a sandwich structure can be used to verify the acceleration voltage, that is the energy output of the electron beam generator. Such information can constitute one parameter used to supervise correct operation of the generator. Moreover, a combination of measurements on both energy output and electron beam intensity can be used to further assure that the packaging material is treated with a sufficient sterilisation dosage.

Figure 5:
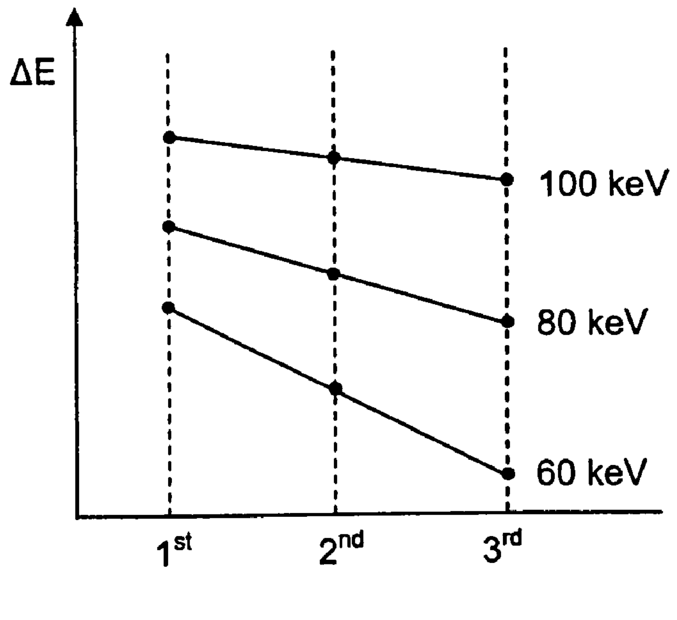
FIG. 5 is a schematic diagram representing output energy from an electron beam generator and energy absorbed in each conductive layer.

In a sensor having, for example, three conductive layers, the first conductive layer, being closest to the filament 21, will absorb more energy than the second layer, which in turn will absorb more energy than the third layer. In FIG. 5 the vertical axis represents the energy absorbed in the layer, ΔE. The horizontal axis represents the conductive layers (denoted $1^{st}$, $2^{nd}$ and $3^{rd}$) of the sensor structure. By plotting the energy absorbed in each layer for a generator having an output energy of, for example, about 80 keV, it is possible to form a substantially well-defined function. For the sake of simplicity, FIG. 5 shows functions in the form of substantially straight lines. If plotting the energy absorbed in each layer for a generator having an output energy of for example about 100 keV, it will as well be possible to form a substantially well-defined function, but the function will differ from the previous one. Another different substantially well-defined function can be formed if plotting the energy for a generator having an output energy for example about 60 keV. The difference in the graphs of the functions can be used to detect whether the actual energy output of the generator corresponds to the expected output, that is whether the actual output is within a certain tolerable range. Further, if a substantially straight line cannot be formed, i.e. if one or several energies $\Delta E$ deviate from the expected, it can be assumed that the generator is not operating correctly.

To facilitate the measuring, the thickness of the conductive layers and the insulating layers is preferably the same.

As mentioned, one of the functions of the shield is to protect the conductive layer or layers from plasma and secondary electrons. In the following, the term or concept of plasma or secondary electrons will be described. When an electron $e^-$ emitted from the filament 22 of FIG. 1 travels towards the target area 4, it will collide with air molecules along this path. The emitted electrons can have sufficient energy to ionize the gas along this path, thereby creating plasma which contains ions and electrons. Plasma electrons are secondary electrons, or thermal electrons, with low energy compared to the electrons from the electron beam 6. The plasma electrons have randomised vector velocity and can only travel a distance which length is a small fraction of the mean free path for the beam electrons.

There will possibly be plasma in the surrounding environment, i.e., outside the exit window 24 of the electron beam generator 8, due to the presence of air. However, since plasma has not enough energy to penetrate the outermost insulating layer, which is covering the outermost conductive layer, it will function as a proper plasma shield.

Another previously mentioned function of the shield 32, 32' is to isolate the bands 26, 26' of a conductive layer from each other, and where appropriate, isolate conductive layers 28', 38 from each other. Thus, there will be a separate signal that can be detected from each band 26, 26', which together can give a clear picture, or map, of the dosage provided to the material 16 which is to be sterilised. Information from each band (e.g., signal amplitudes, signal differences/ratios, band positions and so forth) can be used to produce an emission intensity plot via a processor.

Figure 2:
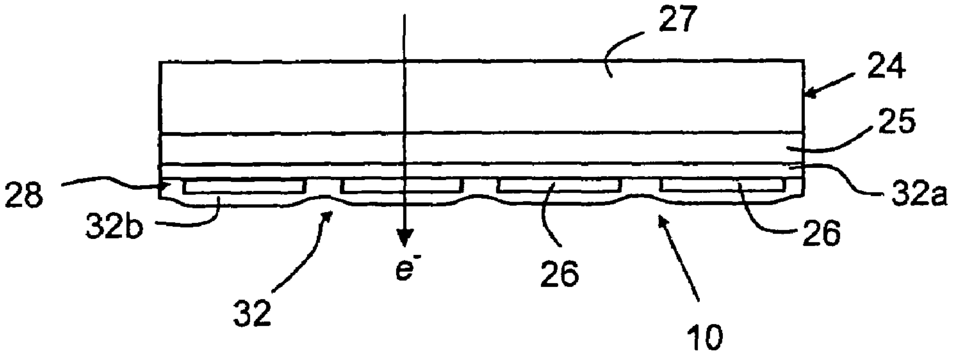
FIG. 2 schematically shows, in cross-section, a first embodiment of a sensor disclosed herein.
Figure 6:
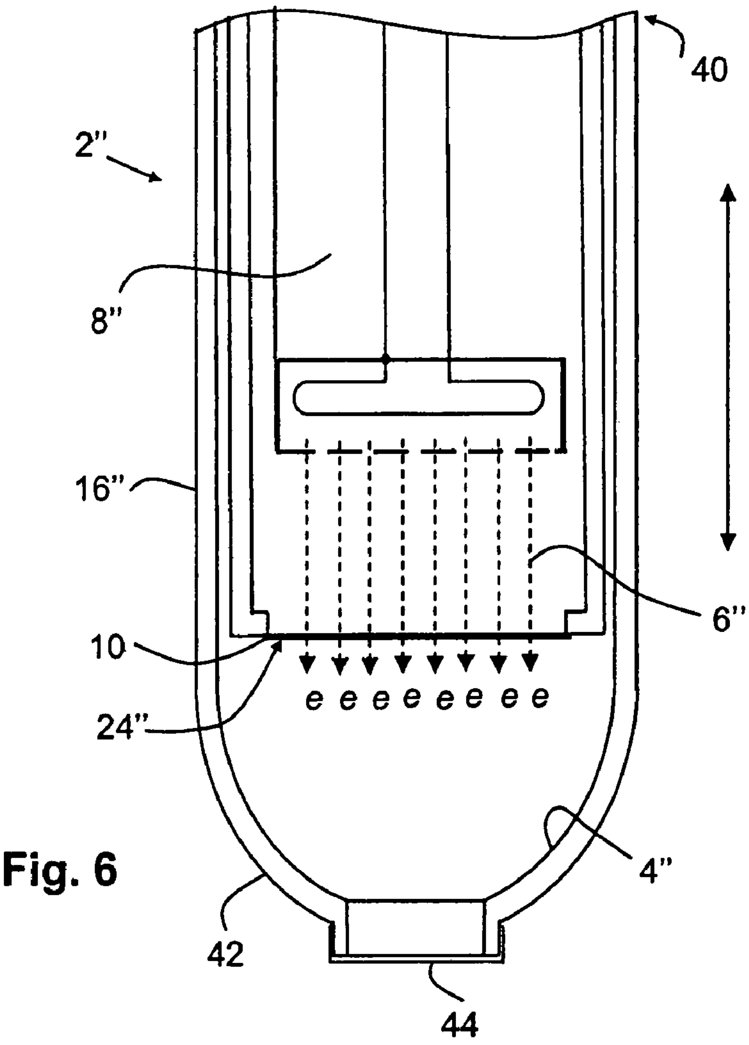
FIG. 6 schematically shows an example of a system similar to that in FIG. 1, but for irradiating a target in the form of a ready-to-fill package.

A sensor like the one described may as well be used in connection with irradiation of targets in the form of partly formed packages. Partly formed packages are normally open in one end and sealed to form a bottom or top in the other, and are commonly denoted Ready-To-Fill packages (RTF packages). In FIG. 6 a system 2" is schematically disclosed comprising an electron beam generator 8" for irradiation of a ready-to-fill package 16". The package 16" is open in its bottom 40 and is provided at the other end with a top 42 and an opening and closure device 44. During sterilization, the package 16" is placed upside down (i.e., the top is located downwards) in a support. The support can be in the form of a carrier of a conveyor which transports the package 16" through a sterilization chamber. The system comprises means for providing relative motion (indicated by the arrow in FIG. 6) between the package 16" and the electron beam generator 8" for bringing them to a position in which the generator 8" is located at least partly in the package 16" for treating it. Either the generator 8" is lowered into the package 16", or the package 16" is raised to surround the generator 8", both are moving towards each other. A sensor 10, for example being the sensor as described in FIG. 2, is formed on an exit window 24" of the generator 8".

Although the present invention has been described with respect to presently preferred embodiments, it is to be understood that various modifications and changes may be made without departing from the object and scope of the invention as defined in the appended claims.

Figure 7:
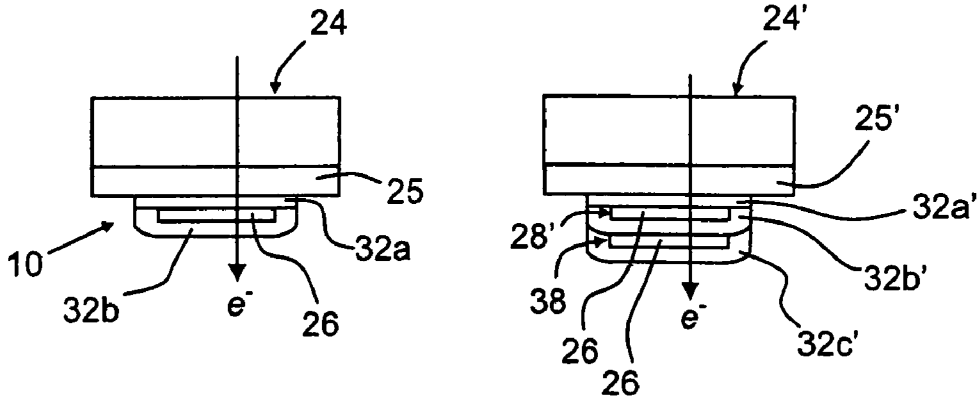
FIG. 7 schematically shows, in cross-section, portions of an alternative to the sensor in FIG. 2 and an alternative to the sensor in FIG. 4.

In the embodiments described, the first insulating layer 32*a*, 32*a'* covers substantially the entire exit window foil 25, 25' and an overlying insulating layer covers substantially an underlying insulating layer. However, it is to be understood that the insulating layers don't practically need to cover more than necessary of each other and the window foil 25, 25' to encapsulate each area 26, 26' of the conductive layers present in the sensor structure. FIG. 7 shows two different alternative embodiments.

The areas in the previously described embodiments have been described as bands 26, 26'. However, it is to be understood that the areas can have any shape, such as for example circles, circles segments, ellipses, arcs, wires, rectangular shapes and stripes, suitable for obtaining a sufficient dosage map.

It has also been described that the sensor is formed on the outside of the electron exit window. It should be understood that it is possible to form the sensor on the inside of the window, i.e., on the surface facing the vacuum chamber 12.

Finally, the embodiment described comprises a shield of insulating material. The shield may also comprise further layers or portions of protective nature for physically protecting the sometimes fragile conductive and insulating layers. Such layers or portions may be placed between the first insulating layer and the window foil and can be of any material suitably used together with the material in said foil. An additional protective layer can also be provided on the outside of the outermost insulating layer for protection from the environment.

What is claimed is:

1. A system for sensing an electron beam comprising:
- an electron beam generator adapted to generate an electron beam exiting from the generator through an exit window and along a path towards a target in a target region;
- a support for supporting the target within the target region; and
- a sensor adapted to detect and measure intensity of the electron beam generated by the electron beam generator, the sensor comprising:
  - at least one area of at least one conductive layer located within the path;
  - a current detector connected to the at least one conductive layer;
  - a shield shielding off the at least one area of the at least one conductive layer from surrounding environment and from the exit window;
  - a portion of the shield being in contact with the at least one area of the at least one conductive layer;
  - the shield being formed on the exit window and at least the portion of the shield in contact with the at least one area being made of insulating material.

2. System according to claim 1, wherein the target is a web of packaging material.

3. System according to claim 1, wherein the support for holding the target in the target region comprises at least one packaging material web transport roller.

4. System according to claim 1, wherein the target is a package.

5. System according to claim 4, further comprising means for providing a relative motion between the package and the electron beam generator to bring the package and the electron beam generator to a position in which the generator is located at least partly in the package for treating the package.

6. System according to claim 1, further comprising an electron beam controller adapted to adjust the intensity of the electron beam in response to an output of the electron beam sensor.

7. System according to claim 1, wherein the at least one area of the at least one conductive layer comprises a plurality of spaced apart areas of the at least one conductive layer, each of the plurality of areas being comprised of a conductive band, and the shield shielding off each of the plurality of areas from one another.

8. A sensor for sensing an intensity of an electron beam generated by an electron beam generator along a path towards a target within a target region, the electron beam exiting from the generator through an exit window, the sensor comprising at least one area of at least one conductive layer located within the path and connected to a current detector, a shield shielding off the at least one area of the at least one conductive layer from surrounding environment and from the exit window, a portion of the shield being in contact with the at least one area of the at least one conductive layer, the shield being formed on the exit window and at least the portion of the shield in contact with the at least one area being made of insulating material.

9. Sensor according to claim 8, wherein the shield comprises at least first and second insulating layers, the first insulating layer covering at least a portion of the exit window and carrying the at least one area of the at least one conductive layer, and the second insulating layer covering the at least one area of the at least one conductive layer so that the at least one area of the at least one conductive layer is encapsulated by insulating material.

10. Sensor according to claim 8, wherein the at least one conductive layer comprises at least a first and a second conductive layer, each comprising at least one area, the shield further comprising a third insulating layer, the first insulating layer covering at least a portion of the exit window and carrying the at least one area of the first conductive layer, the second insulating layer covering the at least one area of the first conductive layer so that the at least one area of the first conductive layer is encapsulated by insulating material, the second insulating layer carrying the at least one area of the second conductive layer, and the third insulating layer covering the at least one area of the second conductive layer so that the at least one area of the second conductive layer is encapsulated by insulating material.

11. Sensor according to claim 8, wherein the at least one conductive layer comprises a plurality of conductive layers, the conductive layers being sandwiched one by one between insulating layers.

12. Sensor according to claim 8, wherein the current detector is adapted to detect electrical current in the at least one area of the conductive layer as a measure of electron beam intensity.

13. Sensor according to claim 8, wherein the sensor is formed on an outer foil of the exit window through deposition.

14. Sensor according to claim 8, wherein the insulating material is an oxide.

15. Sensor according to claim 8, wherein the at least one conductive layer is made of metal.

16. Sensor according to claim 8, wherein the insulating material is aluminium oxide, the conductive layer is made of aluminium and the exit window foil is made of titanium.

17. Sensor according to claim 8, wherein the at least one conductive layer comprises a plurality of areas each comprised of a conductive band located across the exit window.

18. Sensor according to claim 17, wherein the bands are spaced apart from one another so that a gap exists between adjacent bands.

19. Sensor according to claim 8, wherein the target is a package.

20. Sensor according to claim 8, wherein the target is a web of packaging material.

* * * * *